L. DE FOREST.

WIRELESS TELEPHONE SYSTEM.

APPLICATION FILED MAY 10, 1918.

Reissued Oct. 19, 1920. 14,959.

INVENTOR.

BY Lee de Forest

Samuel E. Darby his ATTORNEY

UNITED STATES PATENT OFFICE.

LEE DE FOREST, OF NEW YORK, N. Y., ASSIGNOR TO DE FOREST RADIO TELEPHONE & TELEGRAPH COMPANY, A CORPORATION OF DELAWARE.

WIRELESS TELEPHONE SYSTEM.

14,959. Specification of Reissued Letters Patent. Reissued Oct. 19, 1920.

Original No. 1,183,803, dated May 16, 1916, Serial No. 604,566, filed January 25, 1911. Application for reissue filed May 10, 1918. Serial No. 233,801.

*To all whom it may concern:*

Be it known that I, LEE DE FOREST, a citizen of the United States, residing at New York, county of New York, and State of New York, have made a certain new and useful Invention in Wireless Telephone Systems, of which the following is a specification.

This invention relates to wireless telephone systems, and particularly to the transmitting apparatus employed in such systems.

The object of the invention is to provide a transmitting apparatus for wireless telephone systems wherein the articulation of transmitted voice sounds is made clear and distinct.

A further object is to provide a system of the character referred to wherein inappreciable energy is impressed on the radiating antenna or transmission circuit during periods of no speech.

A further object is to provide a system in which normally balanced or inactive circuits are associated with the radiating antenna or transmission circuit, there being no energy impressed on the circuit during the continuation of the normally balanced or inactive condition, but which balanced or inactive condition is disturbed by and in accordance with sound waves, whereby corresponding high frequency oscillations are impressed on the antenna or transmission system to effect the desired radiations.

A still further object of the invention is to provide a system in which the amplitude of the transmitted high frequency oscillations shall be so controlled or modulated by low frequency waves such as signal or sound waves as to bear a direct relation to the amplitude of the sound waves, whereby said transmitted oscillations will have no component corresponding to the oscillations supplied by the high frequency carrier source.

Other objects of the invention will appear more fully hereinafter.

The invention consists substantially in the construction, combination, location, and relative arrangement of parts, all as will be more fully hereinafter set forth, as shown in the accompanying drawings, and finally pointed out in the appended claims.

Figure 1:
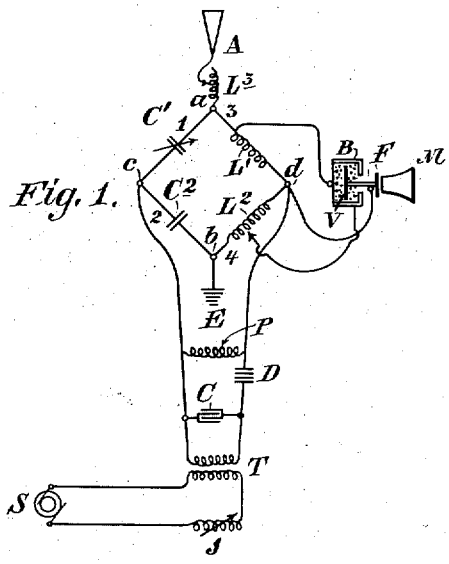
Figure 3:
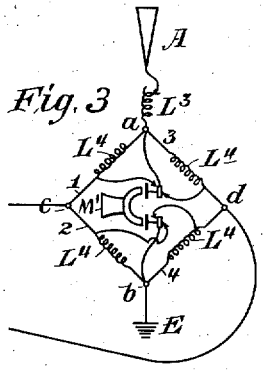
Figure 2:
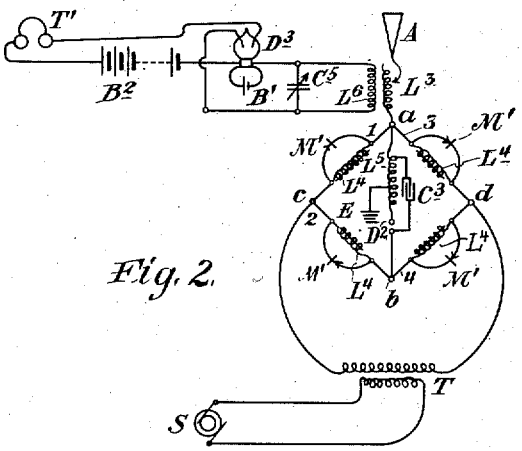

Referring to the accompanying drawings, and to the various views and reference signs appearing thereon, Figure 1 is a view in diagram showing an arrangement of microphone for increasing the unbalancing action due to impressing on the system the sound waves to be transmitted. Fig. 2 is a diagrammatic view showing an arrangement wherein the oscillations are produced in the antenna system. Fig. 3 is a view illustrating another arrangement of microphone connection embraced within the spirit and scope of my invention for increasing the unbalancing effect of the sound waves to be transmitted.

In accordance with the principles of my invention, and in the broad scope thereof, I propose to associate a radiating antenna or transmission system with balanced or inactive circuits in such relation that under normal conditions no energy, or substantially none, is impressed upon the radiating antenna or transmission system until the normal balanced condition thereof is disturbed, and I propose to disturb the normally balanced or inactive condition of said circuits by and in accordance with sonorous vibrations accompanying articulate speech or other sound, thereby impressing corresponding high frequency oscillations upon the radiating antenna or transmission system.

In carrying out my invention I am enabled to employ an alternating or interrupted current source, having a frequency of alternations or interruptions below the upper limit of audibility, thereby enabling me to use ordinary low frequency generators or interrupters, and hence to avoid the complications, expense and troubles incident to the designing and employment of high frequency generators. It will be understood, however, that my invention is not to be limited to the use of low frequency generators but contemplates the employment of any means for producing high frequency oscillations of such character that they may be used as carriers for the transmission of speech or other signals.

The source of current may be associated with the balanced or inactive circuit system in many different ways, and various arrangements for such association are shown in the drawings as illustrative of practical methods of applications of my invention.

The desired unbalancing or disturbing effects and action may be secured in many different ways and various arrangements for accomplishing this result are shown in the drawings as illustrative of the principles involved. In practice, however, I prefer to employ such an arrangement as will secure the greatest disturbance of the balanced or inactive condition.

As above indicated I propose to employ a source of alternating or interrupted current. I have shown an alternating current generator S, as an illustrative arrangement. The source of current is associated with the balanced or inactive circuit system, presently to be described, preferably through a step up transformer T. I have found that a source of alternating or of interrupted current, having a frequency of alternation or interruption of from 60 to 500 cycles, will answer the purpose of my invention, although higher frequencies may be employed if desired. This association of the source of alternating or interrupted current may be directly with the balanced or normally inactive circuit arrangement, as indicated in Fig. 2, or there may be interposed an oscillating system, as indicated in Fig. 1. In the arrangement shown in Fig. 1, the circuit of the current source is associated inductively through the step-up transformer T, with an oscillating circuit in which a discharger D, and an inductance P, are in series with a capacity C, bridged across their terminals. By reason of the association of the circuit of alternating or interrupted current with the oscillating circuit, above described, oscillations are developed in the oscillating circuit in a well understood manner. It is immaterial whether the capacity C bridges the terminals of the discharger D, and inductance P, the latter being in series in the oscillating circuit, or instead, the relative locations of the discharger and capacity be interchanged.

The circuit of the current source may be inductively associated with the oscillating system, as shown in Fig. 1, or it may be directly connected thereto as shown in Fig. 3, and it is obvious that any other well known form of coupling may be employed. The same is true of the coupling of the oscillating circuit with the balanced or inactive circuit system. In Fig. 1, I have shown the oscillating system associated with the balanced circuit system through a conductive coupling, the inductance P, in this case being common to both oscillating and the balanced circuit systems.

Any desired form of discharger D, may be employed, such for instance, as the singing spark radiotone system, indicated at D, in Figs. 1 and 3, or an ordinary spark discharge gap. In the case of the radiotone gap the electrodes are in the form of disks or plates of metal superposed upon but separated from each other sufficiently and in such manner as to leave air-tight spaces therebetween, in the usual manner. In the case of the ordinary spark discharge gap the electrodes may be of carbon or in the form of metal balls. I prefer to employ the quenched spark gap of the radiotone form for the reason that thereby the high frequency oscillations in the oscillating circuit are strongly damped, and there is no reaction of the oscillations in the antenna, or balanced circuit systems upon the oscillating circuit, so that the oscillations normally impressed upon the balanced circuit from the oscillation circuit approximate the character of sustained undamped oscillations. However, the ordinary spark gap has certain advantages as the arc therebetween established allows a large number of discharges per half cycle, thereby rendering the voice sounds as received at the receiving station less disguised or mutilated by the hum or whistling sound, which might accompany the same if the normal balance or inaction of the "bridge circuit" system should be more or less imperfect.

By choosing condensers of small capacity and making the spark gap spaces small in extent, I am enabled to secure a very large number of "partial discharges" of the condensers for each half period of current, particularly if the impressed voltage is relatively large.

I have found it desirable to insert a considerable inductance in the current supply circuit, as indicated at I, which I propose to make adjustable, so that I may be able to employ short discharge gaps and small capacity without establishing a non-oscillating gap across the gap, and existence of which would cause to cease, or to greatly weaken, the "partial discharge."

Where the coupling of the oscillating circuit to the balanced circuit system is conductive, as through an auto-transformer, as indicated in Fig. 1, the coupling coil P, is connected in series to the balanced circuit system.

The balanced circuit system comprises the legs 1, 2, 3 and 4, the legs 1 and 2 being in parallel with the legs 3 and 4, and both sets in series in the antenna earth system, the antenna A, being connected to the balanced circuit system at *a*, and the earth connection E, thereof being connected to the balanced system at *b*, while the terminals of the transformer coil or auto-transformer coil P, as the case may be, are connected to the balanced circuit system at the points *c* and *d*. In the arrangement shown in Fig. 1, each of the legs 1 and 2 of the balanced circuit system contains a capacity, as indicated at $C^1$, and $C^2$, one or both of which may be variable, and the legs 3 and 4, respectively contain the inductances $L^1$, $L^2$, one or both of which may be variable. By reason of the presence of capacities and inductances in the balanced circuit systems this circuit system has a natural period of vibration of its own. The electrical constants of this balanced circuit system should be so chosen that said system is in resonance with the primary oscillating circuit which includes the spark gap, inductance P and capacity C. It is also preferable to employ a variable inductance, as indicated at $L^3$, in the antenna circuit so as to enable the natural period of vibration of said circuit to be brought into resonance with the balanced circuit, and the oscillating circuit systems. Following the well known law of the Wheatstone bridge, the reactance of the four branches, or legs 1, 2, 3, 4, of the balanced circuit system, whether such reactances be inductive or capacitative should be so relatively proportioned that, normally, no difference of potential exists between the points *a* and *b*. In this condition, therefore, no current is impressed upon the antenna system and the balanced circuits are inactive. When the balance of these normally inactive circuits is disturbed, however, as by so varying the inductances $L^1$ or $L^2$, or the capacities $C^1$, $C^2$, one or more, that the ratio $$\frac{\text{reactance of leg 1}}{\text{reactance of leg 2}} \text{ equals } \frac{\text{reactance of leg 3}}{\text{reactance of leg 4}}$$

no longer exists, a potential difference between the points *a*, and *b*, will be established and consequently oscillations will be impressed on the antenna system which will be more or less intense according to the degree of disturbance of the ratio referred to. Since the amplitude of the transmitted oscillations will at all times bear a direct relation to the degree of disturbance of the balance, which in turn is a direct function of the voice or other signal wave, it will be seen that there is no component of the transmitted oscillations corresponding to the oscillations generated in the primary oscillation circuit, but such component is at all times suppressed by the balanced circuit.

Various means and arrangements may be employed for effecting the disturbance of the normally balanced inactive circuits, within the spirit and scope of my invention, and in the case of the use of the apparatus for telephonic transmission purposes I propose to effect such disturbance by and in accordance with the sound waves which accompany articulate speech or other sound, so as to not only impress upon the radiating system resulting oscillations but also, so as to impress upon such oscillations which are varied in intensity according to the sound waves employed in effecting the disturbance of the balance. In other words, the balance of the normally inactive circuit system is disturbed by and in accordance with sound waves, and the radiations from the antenna system conform in intensity to the degree of such disturbance.

A convenient and effective method for accomplishing the unbalancing of the normally inactive circuit system is to connect a microphone in shunt around or in series with one of the impedances. In Fig. 1 I have shown a microphone M connected in shunt around the inductances $L^1$ and $L^2$, and I have found that better results are attained by associating the microphone with an inductance instead of with a capacity. The balance of the system is more effectively disturbed by employing two microphones, one associated with the inductance in each of the two legs of the system which contain inductances, with the microphones so connected up that the resistance of the one will be increased while that of the other is simultaneously decreased by the same sound waves impinging thereon. Fig. 1 shows such an arrangement. Here the diaphragm F is acted upon by sound waves directed thereto through the mouth piece of the microphone M. This diaphragm is rigidly connected to a "button" diaphragm V, on both sides of which are carbon granules contained in insulated chambers in the casing B. The back or end wall of one chamber is connected to the remote terminal or end of inductance $L^1$, in leg 3, while the back or end wall of the other chamber is connected to the remote terminal or end of inductance $L^2$ in leg 4. The proximate ends or terminals of the inductances are connected from their common point Q, to the vibrating member V. In this arrangement it will be seen that the resistance of the carbon granules in one chamber is increased simultaneously with a corresponding decrease in resistance of the granules in the other chamber, and this respective increase and decrease is accomplished by the same sound waves impinging on the diaphragm F. Thus the disturbing effect on the balance of the normally inactive circuit system is doubly amplified. It is obvious that various other methods of securing the balanced condition between the different legs or branches of the system, or of simultaneous effects of two separate circuits upon a third circuit will at once suggest themselves to persons skilled in the art, and likewise various methods of securing disturbances of the balance of said circuits by means of voice or sound actuated microphones so impulses of proportionately varied intensities will be impressed upon, and corresponding radiations effected from, the antenna system.

A variation of the same general principles as above set forth is shown in Fig. 2. Here the balanced circuits are bridged by a circuit connecting the points *a*, and *b*, the antenna A, being connected to earth at E, through this bridge circuit. Also arranged in this bridge circuit is the spark gap $D^2$, which is shunted by a condenser $C^3$, and an inductance $L^5$. Each of the legs or branches 1, 2, 3, 4, contains an inductance $L^4$, and each inductance is shunted by a microphone $M^1$. In this case, also, the current source S, is coupled directly to the balanced circuit system without the interposition of an oscillating circuit, the coupling, in this instance, being shown as inductive through the transformer coils T. Consequently the balanced circuit branches are traversed by alternating or interrupted, currents of low frequency, say 50 to 500 cycles, or higher if desired, as distinguished from the higher frequency or Hertzian currents which traverse the balanced circuit system in the arrangements shown in Fig. 1. In the arrangement shown in Fig. 2 all of the inductances $L^4$, should be of large value as compared with those employed in the arrangements of Fig. 1. Thus in the latter case the inductance coils are preferably wound without iron cores, while the coils $L^4$, of the arrangement of Fig. 2 are preferably wound with laminated iron cores, as indicated. It will be observed that the balanced circuit legs or branches 1, 2, 3, 4, in this arrangement do not contain capacity, for, if capacities were employed they would be required to be of very large value, say, of the order of microfarads. The balance of the circuits in this arrangement shown in Fig. 2 may be secured by suitably adjusting one or more of the inductances $L^4$, in the legs or branches 1, 2, 3, 4. This may be accomplished by making the laminated cores of the inductance coils movable and inserting, or withdrawing the same, more or less, into or from the coils. When the balanced condition is attained by suitable adjustment of the inductances, no difference of potential, or practically none, will ordinarily, or normally, exist across the terminals of the spark gap $D^2$. This spark gap should be small in this case.

While I have shown a microphone shunting each inductance $L^4$, I do not desire to be limited in this respect. Where four microphones are employed I prefer to actuate the diaphragms thereof simultaneously by sound waves delivered thereto through a mouthpiece common to all of them, and in order to amplify the unbalancing effect of the sound vibrations upon the normally inactive circuit system, I prefer to so arrange the microphone diaphragms in relation to their associated inductances as to increase the resistance in two of the legs or branches, say the legs or branches 1 and 4, while simultaneously reducing the resistance in the other legs or branches 2, 3. With this arrangement the balance of the bridge is greatly disturbed by the action of the sound waves impinging on the microphone diaphragms and considerable difference of potential will be instantaneously developed across the spark gap $D^2$, and an oscillatory discharge will take place thereacross and in the circuit $L^5$, $C^3$, $D^2$, the intensity of the discharges being governed by the degree to which the bridge balance has been disturbed. In Fig. 3 I have shown one arrangement of the four microphones of Fig. 2, so connected and associated with their respective inductance coils that the resistance in legs or branches 1 and 4 is increased simultaneously with a decrease of the resistance in the legs or branches 2 and 3.

It will be understood that in any of the various arrangements shown the inductances may be replaced by resistances, but this is not recommended on account of losses of energy due to the heat developed in resistance coils.

The arrangement shown possesses the advantage that the receiving apparatus associated with the generating and radiating apparatus at a transmitting station is not acted upon in any way by such transmitting apparatus except during the time the transmitter diaphragms are being actually operated by sound waves impinging thereon. This enables me to attain to and fro conversation without the necessity of switching over from sending to receiving. In Fig. 2 I have shown a typical receiving circuit arrangement suitably coupled, in this instance inductively, with the tuning coil $L^3$, in the antenna circuit, through an inductance coil $L^6$. The receiving circuit shown includes the telephone receiver $T^1$, the detector $D^3$, in this case shown as an audion, the telephone battery $B^2$, the audion filament battery $B^1$, and the variable capacity $C^5$, these being arranged in the usual or any well known manner familiar to those skilled in the art.

It will be observed that in its broad scope my invention contemplates the use of a balanced or normally inactive circuit system associated with a radiating antenna or transmission system and a source of energy in such relation that the radiating antenna or transmission system is not materially influenced or affected except only when the balanced or normally inactive condition of the circuit system associated therewith is disturbed, and, when such disturbance is effected, the radiating or transmission system is supplied with energy the intensity of which varies according to the degree of such disturbance, and hence by employing voice or other sounds to effect the balance disturbance, oscillations are secured which carry variations in intensity imposed by and in accordance with sound waves. The oscillations transmitted by means of an arrangement of this character at all times bear a direct relation to the controlling sound wave so that there is present in said oscillations no component corresponding to the oscillations supplied by the oscillation source. By this arrangement I am enabled to secure a much greater degree of variation in the intensity of the radiations than has heretofore been possible in wireless or high frequency telephonic work, and hence am enabled to secure sharper, clearer and more distinct articulation in the receiving apparatus, and am enabled to employ low frequency generators or interrupters as the source of primary current, thereby eliminating many of the complexities and difficulties which have heretofore attended the use of high frequency generators for use in this class of work, besides greatly simplifying the apparatus and circuit arrangements, and eliminating many of the delicate adjustments heretofore required in maintaining wireless or high frequency telephone systems in operative conditions.

Having now set forth the object and nature of my invention and various embodiments of the principles thereof, what I claim as new and useful, and of my own invention, and desire to secure by Letters Patent is:—

1. An antenna system, a source of energy therefor, a circuit system interposed between the source of energy and the antenna system, said interposed circuit system being normally balanced to restrain the impression of energy from the source upon the antenna system, sound actuated means for disturbing the balanced condition of said circuit system, and means for amplifying the balance disturbing action of said sound actuated means.

2. An antenna system, a source of energy therefor, a circuit system composed of normally balanced branches or legs arranged in association with the energy source and antenna system, and sound-actuated means to increase the resistance in one of said branches or legs, and operating to simultaneously decrease the resistance in another of said branches or legs, to amplify a disturbance of the balanced condition of said circuit system.

3. In a signaling system wherein signals are transmitted by the agency of high frequency carrier oscillations modulated in accordance with a low frequency wave, the method of transmission which consists in transmitting approximately exclusively a series of modulated oscillations having no component corresponding to the carrier oscillations.

4. In a signaling system the method of transmission which consists in generating high frequency oscillations, modulating said oscillations in accordance with waves of another frequency, preventing the transmission of the unmodulated high frequency wave, and transmitting modulated high frequency oscillations having no component corresponding to the high frequency oscillations originally generated.

5. The method of transmission of high frequency telephonic signals which consists in generating high frequency oscillations, and oscillations of another frequency, impressing both of said oscillations upon a modulating apparatus, suppressing the unmodulated portion of the resultant oscillations and transmitting only oscillations having no component corresponding with said first mentioned high frequency oscillations.

6. The method of high frequency telephonic signal transmission which consists in generating high frequency oscillations and oscillations in accordance with speech signals, impressing both of said oscillations on a modulating device, suppressing the unmodulated component of the resultant oscillations and transmitting only modulated oscillations having no component corresponding to said first mentioned high frequency oscillations.

7. In a signaling system, the method of signal transmission which consists in generating high frequency waves, generating waves of another frequency, modulating said high frequency waves in accordance with said waves of another frequency, automatically preventing the transmission of energy in the absence of said latter waves and preventing the transmission of unmodulated energy when said waves are present.

8. The method of high frequency carrier wave transmission which comprises producing and transmitting only modulated waves from which the component depending solely on the function of the carrier wave is absent.

9. The method of producing an electric current wave of high frequency with groups of amplitude pulsations corresponding to the pulsations of a modulating wave, which consists in deriving a fundamental electric current wave from a source of pulsating electric current energy of high frequency, subjecting said fundamental wave to the action of two impedances, alternately varying from their respective maximum and minimum values and combining the waves resulting from the actions of said variable impedances to produce the desired electric current waves.

10. The method of producing an electric current wave of high frequency with groups of amplitude pulsations corresponding to the pulsations of a modulating wave, which consists in deriving a fundamental electric current wave from a source of pulsating electric current energy of high frequency, subjecting said fundamental wave to the actions of two impedances, varying the values of said impedances so that the maximum value of one impedance coincides with the minimum value of the other impedance and combining the waves resulting from the actions of said variable impedance to produce the desired electric current wave.

11. In a signaling system, means for producing a high frequency wave, means for modulating said wave by waves of another frequency, and means for suppressing the unmodulated component of the modulated wave.

12. In a signaling system, means for producing a high frequency wave, means for modulating said wave by waves of another frequency, and means for transmitting approximately exclusively a modulated wave having no component corresponding to the original high frequency wave.

13. In a signaling system, means for producing a high frequency wave, means for modulating said wave by waves of another frequency, and means for suppressing the unmodulated portion of the resultant wave and transmitting a wave having no component corresponding to the original high frequency wave.

In testimony whereof I have hereunto set my hand on this 22nd day of April, A. D. 1918.

LEE DE FOREST.